United States Patent [19]

Winters

[11] 3,873,428

[45] Mar. 25, 1975

[54] PREFERENTIAL GOLD ELECTROPLATING

[75] Inventor: Earl Dallas Winters, Quakertown, Pa.

[73] Assignee: Bell Telephone Laboratories, Incorporated, Murray Hill, N.J.

[22] Filed: Feb. 19, 1974

[21] Appl. No.: 443,625

[52] U.S. Cl. .................................. 204/15, 204/46 G
[51] Int. Cl. ........................... C23b 5/48, C23b 5/24
[58] Field of Search ................... 204/15, 46 R, 46 G

[56] References Cited

UNITED STATES PATENTS

| | | | |
|---|---|---|---|
| 3,287,612 | 11/1966 | Lepselter | 317/235 |
| 3,380,898 | 4/1968 | Danemark et al. | 204/46 G |
| 3,514,379 | 5/1970 | Neill | 204/15 |
| 3,669,852 | 6/1972 | Winters | 204/46 G |
| 3,700,569 | 10/1972 | Newby | 204/15 |
| 3,791,941 | 2/1974 | Bick | 204/46 G |

*Primary Examiner*—T. M. Tufariello
*Attorney, Agent, or Firm*—G. S. Indig

[57] ABSTRACT

Selective soft gold electroplating of noble metal regions on composite surfaces, including exposed titanium regions, is expedited by small lead addition to the electroplating bath. Improvement in selectivity most evident subsequent to the onset of plating permits increasing plating voltage and corresponding increase in plating density. The procedure is applicable to the fabrication of silicon integrated circuits.

9 Claims, 1 Drawing Figure

PATENTED MAR 25 1975 3,873,428
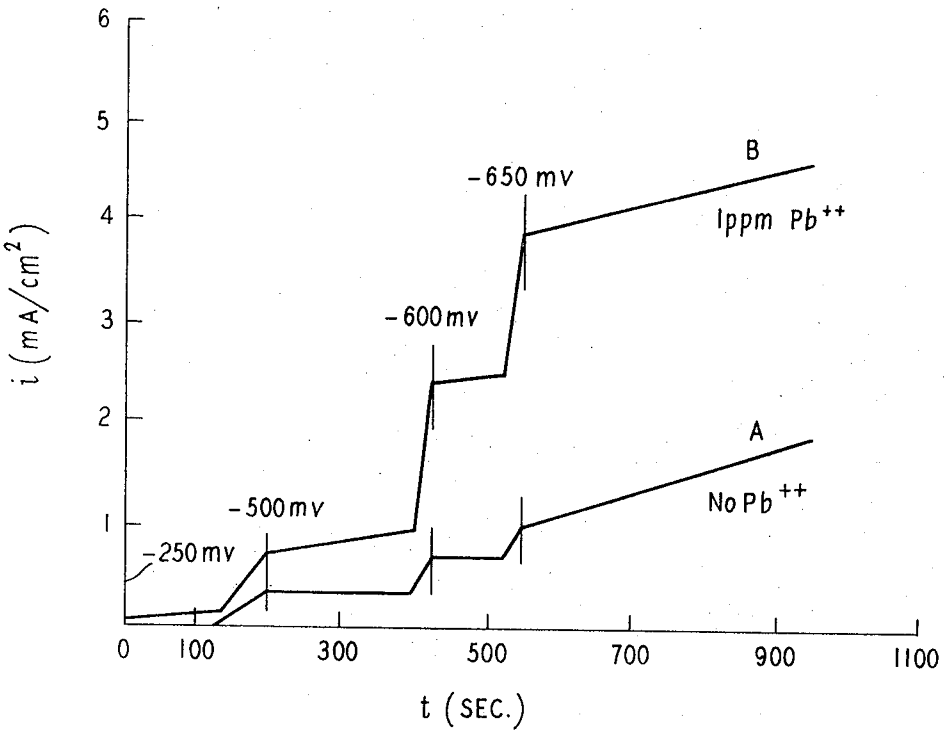

PREFERENTIAL GOLD ELECTROPLATING

BACKGROUND OF THE INVENTION

1. Field of the Invention

The invention relates to the electroplating of electronic grade gold. Of particular interest is the selective electroplating of specified regions of one metal composition on a composite surface including regions of differing metal composition.

2. Description of the Prior Art

An accepted procedure for the fabrication of silicon integrated circuits is described in exemplary terms in U.S. Pat. No. 3,287,612. This procedure, and later developed variations, usually depend on a gold electroplating step for increasing conductivity of interconnections and contact areas represented as noble metal regions (usually platinum or palladium) on a surface otherwise covered by titanium. In general, the otherwise titanium regions are covered by a resist during electroplating.

While this procedure has been applied successfully, there are limitations in resolution which may restrict its adaptation to smaller dimensioned circuitry. Loss in resolution has been traced to "underplating", that is, to electrodeposition of gold on resist-covered titanium regions bordering noble metal regions.

Studies undertaken to minimize underplating have been based, inter alia, on the difference in onset potential for initial gold nucleation on the two substrate metals—e.g., platinum or palladium, on the one hand, and titanium, on the other. Such studies, reflected by the description and claims in copending U.S. application Ser. No. 443,624 filed Feb. 19, 1974 (Newby-Winters Case 3–2), are based on the recognition that initial gold plating may take place on a noble surface at a smaller negative potential than that required on titanium. In accordance with this copending application, procedures based on the use of plating potentials intermediate the onset values for the two substrate metals are used to advantage to avoid underplating in the usual procedure where the titanium layer is covered by an organic resist. This differential plating approach is also applied to the preferential plating of noble metal regions on composite surfaces including bare titanium regions.

The approach described in the preceding paragraph, while certainly permitting more expedient processing, is, itself, somewhat limited particularly in that type of operation in which both titanium and noble metal are exposed to the electroplating bath. In general, it has been found that use of conventional electronic grade soft gold plating baths at plating densities considered expedient—i.e., one milliampere per square centimeter or greater—still result in some gold deposit on the titanium regions. Such deposits, while frequently discontinuous, may, nevertheless, be retained during subsequent processing and may, themselves, limit resolution or even result in some increase in reject rate.

A parallel development, recognized as of extreme significance in electronic grade gold electroplating, in general, involves addition of extremely small quantities of lead to the usual soft gold plating bath. Such additions, beneficially incorporated both initially and during subsequent use, have been found to permit increased plating current densities without deterioration in deposit properties. This is described in copending U.S. application, Ser. No. 317,600 filed on Dec. 22, 1972.

SUMMARY OF THE INVENTION

In accordance with the invention, selectivity for gold electroplating as between noble metal regions— such as, platinum or palladium, on the one hand, and titanium regions, on the other—is enhanced. Such enhancement, of greatest significance subsequent to the onset of plating, permits increasing plating potential with concomitant increased plating density. Plating density may, in accordance with the invention, attain levels of the order of a milliampere per square centimeter and greater at a stage in the electroplating corresponding with deposit thickness of less than a one-half micrometer. Levels as high as 15 $ma/cm^2$ and higher have been attained in the course of metallization to achieve thickness of from 1–2 micrometers of deposit.

The inventive procedure is dependent upon the continued presence of from 20 parts per billion to 2 parts per million of lead in the plating bath based on the entire solution. Most efficient utilization is dependent upon the observed relationship between maximum current density (with continued discrimination) and pH. In general, permitted current density increases with increasing pH value. A preferred pH range is defined by a minimum of about 5. The upper limit on the range, for many purposes at about 10, is dependent on other considerations, such as, susceptibility of resist material to attack by strongly alkaline solution.

BRIEF DESCRIPTION OF THE DRAWING

The FIGURE, on coordinates of current density expressed in milliamperes per square centimeter on the ordinate and time in seconds, includes two curves relating these parameters for a particular increasing plating potential schedule; one for a standard unmodified gold plating solution and the other for a lead-modified solution in accordance with the invention.

DETAILED DESCRIPTION

1. The FIGURE

The curves depicted are representative of a large set of data measured under a variety of plating conditions and utilizing varying compositions within the claimed scope. The main advantage of the inventive teaching is evident from a comparison of curves A and B, the first representing an unmodified commercial electronic grade dicyanoaurate bath (A) and the second (B) representing the same bath to which approximately 1 milligram of $Pb^{2+}$ has been added to each liter of plating bath. For the particular set of data plotted, the surface to be plated, consisting of regions of palladium and titanium was initially biased cathodic at −250 millivolts (mv) relative to a saturated calomel electrode (see "Electroanalytical Chemistry", 2nd. Ed., J. J. Lingane, Interscience, N.Y. 1958, p. 27). Initial current density was negligible for the unmodified bath and was at a level of about 0.1 $ma/cm^2$ for the modified bath. After a period of about two minutes, the cathode voltage was increased to −500 mv. Upon attainment of this potential, current density increased to values of approximately 0.4 and 0.8 $ma/cm^2$. During the period immediately following this voltage change, the current density, in the instance of the lead modified bath, increased to about 1 $ma/cm^2$, while the current flow in the unmodified bath stayed essentially constant. After a further interval of about 2 minutes, voltage was again increased, this time to a level of about −600 mv. This further change resulted in a very sharp increase in current density to an initial value of 2.5 ma/cm$^2$ in the instance of the lead modified bath while the current density in the unmodified bath attained a level of only about 0.8 ma/cm$^2$. After a total plating time of about 8½ minutes, a deposit thickness of about 0.5$\mu$m was achieved in the modified bath. Subsequent increases, as indicated, resulted in a final current approaching 5 ma/cm $^2$ in the lead-modified bath and about 2 ma/cm$^2$ in the unmodified bath. Final gold thickness was about 2$\mu$m for the modified bath and about 0.65$\mu$m for the unmodified bath.

In fact, the plated products produced in accordance with the experiments corresponding with curves A and B of the FIGURE were not comparable. Aside from the increased plating thickness represented by curve B, the photomicrograph showed no detectable nucleated gold on the titanium regions as plated from the lead-containing solution. By contrast, pronounced gold nuclei numbering perhaps 40,000 per square millimeter were in evidence on the plated sample corresponding with curve A. From other data, it may be estimated that a 2 micrometer thick gold plated surface with an essentially undetectable gold-on-titanium count may be produced in an unmodified bath under the conditions resulting in the FIGURE by limiting voltage to a maximum of approximately −500 mv. Since this bias results in a current density maximum of only about 1 ma/cm$^2$, the total time required is approximately four times as long as that required under the conditions corresponding with curve B (approximately 1 hour as compared with fifteen minutes for curve B).

Onset potentials have been carefully measured for a number of metals under a variety of conditions. Values set forth in the following table are illustrative. All values are in millivolts as measured with reference to a saturated calomel electrode.

TABLE

| | pH 5 | pH 7 | pH 8 | pH 10 |
|---|---|---|---|---|
| Pt | +105 | −156 | −302 | −320 |
| Pd | +155 | −80 | −180 | −170 |
| Au | +155 | | −214 | −255 |
| Ti | −275 | −312 | −394 | −434 |

While onset potentials show a definite variation with pH, required bias generally increasing with increasing pH, the more significant parameter—i.e., the differential bias representing the permissible initial working range for preferential plating—shows no significant variation. The tabulated values are of practical interest only in specifying the initial required potential for plating. So, for example, at a pH of 5, a bias in the range of from +105 mv to −275 mv results in the preferential plating of platinum. A possible commercial mode of operation not requiring a reference electrode would utilize a current detecting circuit and would initiate a preprogrammed increasing voltage schedule upon commencement of plating corresponding, for example, to a level of 0.05 ma/cm$^2$.

In general, the curve forms of the FIGURE are fairly illustrative for all compositions and plating conditions permitted in accordance with the invention. The pH value parameter is of primary significance. while it is quite feasible to preferentially plate a noble metal on a composite surface including titanium at a pH value as low as 5 or lower, permitted current density is considerably less for conditions otherwise identical to those upon which the FIGURE is based. For example, it may be estimated that whereas a current density of 2 ma/cm$^2$ may be attained during plating of 1 micrometer of gold at a pH of 7 or higher, maximum permitted current density at a pH of 5 may attain a level of only about 1 ma/cm$^2$ for the same plating thickness. Increasing pH, it is indicated, permits still greater current density so that it may be expected that a current density of 2 ma/cm$^2$ may be attained for a plating thickness of 0.5$\mu$m or less at a pH of 9 or 10. Indicated current densities all correspond with production of an acceptable product—i.e., a composite surface including titanium as well as the noble metal to be plated in which gold nuclei of the order of 2000 A. or larger are essentially absent.

In general, permitted current densities do not vary significantly with variation in other parameters, such as gold concentration, temperature, etc., within the ranges specified in Sections 2 and 3.

2. Compositional Considerations

A. Conventional Compositions

A conventional soft gold plating bath intended for electrolytic plating contains only a gold complex salt and salts as required for buffering to a desired pH and for attaining required ionic conductivity. Conventional baths are aqueous. Unintentional contaminants, e.g., silver, iron, nickel, and cobalt, are ordinarily very low. A level of < 0.01 percent based on emission spectroscopic and atomic absorption analyses is typical. In common with general practice, bath comosition composition in terms of g/l (grams of solid per liter of plating solution).

Gold — approximately 3 g/l to solubility limit. The most common salt for plating electronic devices is potassium dicyanoaurate, $KAu(CN)_2$. A common alternative, the corresponding sodium complex salt, is generally undesirable for electronic purposes, since it may result in sodium contamination. The low limit of about 3 g/l permits a maximum attained plating current density of approximately 2 ma/cm$^2$. In general, lower gold content is uncommon, due to the limited current density range and frequent need for replenishment. While the absolute limit is the solubility limit corresponding with about 145 g/l for $KAu(CN)_2$ at room temperature, a lower preferred maximum is usually specified. This preferred maximum is about 120 g/l and is dictated by the desire to minimize loss of gold through dragout (significant loss of gold in solution in the wetting layer on the withdrawn cathode). A gold salt content of 20 g/l is sufficient for plating to a practical maximum rate under most conditions and was used for the solutions reported in the examples herein.

Additional salts — 25 g/l – 250 g/l. These additional salts are incorporated for either of two reasons; to attain (and maintain) desired pH, and/or to maintain desired ionic conductivity level. Where a buffer salt system is incorporated, it may inherently increase the conductivity to the desired level thereby eliminating need for a conductivity-increasing constituent. It will be recognized that the limits indicated are primarily practical. A minimum of 15 g/l of usual salts such as phosphate, citrate, or acetate assures a conductivity of the order of 0.015 – 0.025 Mhos at a temperature of 25°C. This minimum is also generally required for most buffered systems to produce sufficient buffer action to maintain pH over resonable life at reasonable plating rates. The indicated maximum exceeds the quantity of buffer ordinarily required to maintain pH during expected life. As an example, the solutions used for the plating procedures which resulted in the data plotted for the FIGURE were buffered to a value of pH 8.0 by use of 35 g/l of $KH_2PO_4$ (corresponding to 24 g/l of $PO_4^{3-}$) together with about 13 g/l of KOH. There is a large number of buffer salts in use, and sufficient experimentation has been conducted to conclude that no limitation is imposed on the class by the invention. Exemplary salts include the dibasic and tribasic phosphates (generally potassium or ammonium—sodium is avoided for the same reason that it is undesirable as the cation in the gold complex) as well as ammonium salts including citrate, sulfate, phosphate, potassium carbonate, potassium bicarbonate, potassium acetate, potassium cyanide, and corresponding acids, such as phosphoric, citric and acetic acid, etc. The basic member of the buffer system, wherever needed, is commonly potassium hydroxide, although other alkaline material may be utilized. General plating experiments have been conducted successfully in unbuffered potassium dicyanoaurate solution at higher pH (10 to 13) although such high pH values may otherwise be undesirable—e.g., because of resist attack. Salts which may be used for increasing conductivity without having a significant effect on pH include potassium sulfate, potassium cyanate, and potassium formate.

Commercial soft gold electrolytic baths for electronic purposes have been analyzed as containing of the order of parts per million (generally less than 1 ppm) total impurity content when freshly made up. It may be inferred from permitted plating densities and deposit characteristics as well as data such as that of the FIGURE, that this impurity content does not include as much as 20 ppb of lead. Common impurities contributing to the indicated impurity level are: Ag, Fe, Ni, Co. After prolonged use, a bath may attain an impurity content sufficiently high to "harden" the resultant deposit. Offensive impurity, e.g., Ni, is conventionally removed by reducing pH to a level of about 6.5 and then buffering to the desired operating level.

B. Lead Addition

As indicated, lead level in terms of part of metal per liter of solution is, from the standpoint of maintenance, desirably maintained at a minimum of 100 ppb, although 20 ppb results in improvement. This amount has been found to result in a marked improvement in permitted current density as compared with unmodified fresh solution and it is also a sufficient level at which to maintain solutions during use. A maximum of about 2 ppm on the same basis is prescribed, since appreciably larger amounts tend to produce platings of inferior morphology. This is a non-preferred limit, however, for many purposes since platings may contain detectable levels of lead. Hardness of platings produced from solution containing 2 ppm lead is about 90 on the Knoop scale, which is the maximum hardness generally prescribed for "soft gold". A preferred upper limit of about 1 ppm is prescribed, since lead inclusions in the deposit, while still detectable, are sufficiently low to have only minimal effect on the deposit. Below a level of about 500 ppb of Pb in solution, deposits contain practically no lead detectable by ordinary means. This is, therefore, a more preferred maximum limit. A preferred minimum is about 100 ppb, since this level is adequate to permit maximum plating rates and is sufficiently high so that the rate of depletion does not require lead replenishing more frequently than the conventional rate of gold replenishing.

Lead may be added in any form which is soluble in the solution. It is generally present as $Pb^{2+}$ or $Pb(OH)_2$ and/or $Pb(OH)_3$. By reason of the very small amount of additive material, it is convenient to prepare a stock solution which may then be diluted as needed. It has been found convenient to make additions in the form of measured quantities of a 1.000 g/l solution prepared from 1.077 g/l PbO dissolved in 0.1 molar KOH.

3. Procedure

Essentially, plating of composite surfaces in accordance with the invention commences with initial nucleation on the noble metal region/s at a cathode potential intermediate the onset potential for such region/s and that of titanium. As indicated, this initial value may be determined from fundamental data, such as that set forth in the Table and by calibration, for example, by reference to a saturated calomel electrode. Alternatively, as also indicated, it is necessary only to increase potential until measurement of some finite plating current, for example, corresponding with 0.05 ma/cm². Commercially, this may take the form of an initial bias of 250 mv for a minute followed by an increasing bias schedule at an initial rate of 100 to 300 mv/minute to a plateau of 650 mv corresponding with a density of 3 to 4 ma/cm². Limiting conditions are dependent on a number of factors including degree of agitation. Tolerable limits may be determined by visual inspection for gold nuclei on titanium surfaces. Nuclei of 2,000 A. are easily detected with magnification of 500x.

Other operating conditions may follow standard practice. Bath temperature is conveniently maintained within the range of from 65°C to 75°C with a broad range defined as from 60°C to 85°C. Exceeding the maximum level may result at some significant loss of solution through evaporation while operation at temperature less than 60°C may result in hardened deposits due to a change in growth morphology and possibly also to carbon inclusion.

Other parameters, such as electrode spacing, electrode configuration, etc., may also follow usual practice. See, for example, *Electroplating Engineering Handbook*, 3rd Edition, A. K. Graham, Van Nostrand Reinhold Company, New York (1971).

4. Examples

The following examples were conducted on a patterned substrate with patterning consisting of platinum or palladium circuitry on a continuous titanium layer. The entirety was, in every instance, supported by a silicon wafer of device grade. The circuit pattern represented a silicon integrated circuit with dimensions sometimes as fine as 10 μm noble metal separated by 10 μm spacing. In each instance, this substrate was made cathodic as immersed within an aqueous gold plating solution with the anode being nondisposable and constructed of platinum or platinum-coated titanium.

EXAMPLE 1

The solution was of the following composition:

| | |
|---|---|
| $KAu(CN)_2$ | 20 g/l |
| KOH | ~13 g/l |
| $KH_2PO_4$ | 35 g/l |

The solution had a pH of approximately 8; plating was carried out at 70°C; a product showing no discernible gold nucleation on the titanium regions under 500× magnification with a gold thickness of 2μm was produced in accordance with the schedule shown in curve B of the FIGURE.

EXAMPLE 2

The plating procedure of Example 1 was followed, however, in accordance with an increasing current density schedule starting with an initial bias of approximately 250 millivolts which was increased to about 500 millivolts at 100 seconds, then to an attained level of 650 millivolts at 250 seconds and to a terminal value of 860 millivolts after a total elapsed time of 380 seconds. A continuation of the process to a thickness corresponding with that of Example 1 resulted in a plating of the same quality as measured under the conditions noted.

EXAMPLE 3

The procedure of Example 1 was repeated, this time with an initial bias of 500 millivolts which was increased to a terminal level of 860 millivolts over a period of approximately 30 seconds starting 100 seconds after initiation. Results were essentially identical to those of Example 1.

EXAMPLE 4

Example 1 was repeated with an initial bias of 300 millivolts which after 100 seconds was slowly and continuously increased to a level of about 660 millivolts over a period of 350 seconds. This procedure is essentially the equivalent of that of Example 1 (Curve B of the FIGURE) with the continuously increasing bias approximating average values attained during the stepwise procedure depicted. Plating thickness and quality were essentially indistinguishable from that produced in Example 1.

EXAMPLES 5 – 7

The procedures of Examples 1, 2, and 4 were repeated, however, with the following bath composition:

| | |
|---|---|
| $KAu(CN)_2$ | 40 g/l |
| KOH | 50 g/l |
| $KH_2PO_4$ | 240 g/l |
| pH | 7 |

While results in each instance were as characterized in preceding examples (no discernible unwanted gold nuclei at magnification of 500×), lowered onset potentials (see Table supra.) in turn resulted in increased plating density for each bias level. An average increase of about 50 percent in plating density resulted in an overall corresponding decrease in required plating time.

EXAMPLES 8 – 10

Examples 5 – 7 were repeated, however, with a composition containing 85 g/l KOH to yield a pH of 8. Ultimate results were essentially unchanged. Times required to attain a plating thickness of 2μm, since pH dependent, were essentially the same as those for Examples 1, 2, and 4.

A variety of experiments were conducted to determine the applicability of inventive method to different metals and under different conditions. For example, onset potentials for the various metals noted were measured in bath compositions of pH values from 4.9 to 10. The nature of the baths were also varied so, for example, a certain of the compositions utilized included citric acid or dibasic ammonium citrate.

What is claimed is:

1. Method of selectively electroplating soft gold on a noble metal region of a composite surface including exposed titanium in accordance with which the said surface is immersed in an aqueous electroplating solution containing a soluble gold salt with said immersed surface being biased cathodically with reference to an immersed anode, characterized in that the said solution contains lead with the amount of lead in solution being maintained at a level of from about 20 ppb to 2 ppm based on the said solution, in that the said surface is biased at a level intermediate the onset potential for the said noble metal and titanium, and in that the absolute value of the cathode potential is increased to result in a current density of at least 1 $ma/cm^2$ before attainment of a deposited gold layer of 1 μm.

2. Method of claim 1 in which the absolute potential of the said surface is first maintained within the range intermediate the onset potentials for the said noble metal and titanium for a period sufficient to result in a visible plating following which such potential is increased to finally attain a bias of a value corresponding with a value at least about −500 mv as measured relative to a calomel electrode.

3. Method of claim 2 in which the said bias is increased stepwise.

4. Method of claim 2 in which the said bias is continuously increased.

5. Method of claim 1 in which the said noble metal region contains platinum.

6. Method of claim 1 in which the said noble metal region contains palladium.

7. Method of claim 1 in which the said noble metal region contains gold.

8. Method of claim 1 in which the said composite surface consists of a pattern of the said noble metal deposited on a continuous layer of titanium.

9. Method of claim 1 in which the pH of the said solution is from about 5 to about 10.

* * * * *

UNITED STATES PATENT OFFICE
CERTIFICATE OF CORRECTION

PATENT NO. 3,873,428

DATED March 25, 1975

INVENTOR(S) Earl Dallas Winters

It is certified that error appears in the above-identified patent and that said Letters Patent are hereby corrected as shown below:

Column 4, line 35, delete "comosition";

line 36, after "position" and before "in" insert --is--.

Column 5, line 55, "part" should read --parts--.

Signed and sealed this 17th day of June 1975.

(SEAL)
Attest:

RUTH C. MASON
Attesting Officer

C. MARSHALL DANN
Commissioner of Patents and Trademarks